United States Patent [19]
Schwartz et al.

[11] Patent Number: 6,118,894
[45] Date of Patent: Sep. 12, 2000

[54] INTEGRATED CIRCUIT PROBE CARD INSPECTION SYSTEM

[76] Inventors: Rodney E. Schwartz, 1526 E. La Vieve La., Tempe, Ariz. 85284; Glenn M. Wirick, 815 N. 52nd. St., #2298, Phoenix, Ariz. 85008; Gary B. Rogers, 61 N. Standage Rd., Mesa, Ariz. 85201

[21] Appl. No.: 08/784,560

[22] Filed: Jan. 21, 1997

Related U.S. Application Data

[62] Division of application No. 08/072,206, Jun. 4, 1993, Pat. No. 5,657,394.

[51] Int. Cl.[7] ........................................ G06K 9/00
[52] U.S. Cl. ............................ 382/151; 324/758
[58] Field of Search .................... 382/141, 151, 382/152, 209, 218, 291, 153, 103; 348/87, 95, 126; 324/754, 758, 158 P, 761

[56] References Cited

U.S. PATENT DOCUMENTS

| | | |
|---|---|---|
| 3,835,381 | 9/1974 | Garretson et al. . |
| 3,849,728 | 11/1974 | Evans . |
| 3,905,008 | 9/1975 | Hagemann . |
| 4,161,692 | 7/1979 | Tarzwell . |
| 4,382,228 | 5/1983 | Evans . |
| 4,554,506 | 11/1985 | Faure et al. . |
| 4,599,559 | 7/1986 | Evans . |
| 4,757,256 | 7/1988 | Whann et al. . |
| 4,812,901 | 3/1989 | Karasawa . |
| 4,831,316 | 5/1989 | Ishiguro et al. . |
| 4,843,315 | 6/1989 | Bayer et al. . |
| 4,855,928 | 8/1989 | Yamanaka . |
| 4,918,374 | 4/1990 | Stewart et al. . |
| 4,919,374 | 4/1990 | Julian . |
| 4,929,893 | 5/1990 | Sato et al. . |
| 5,060,371 | 10/1991 | Stewart et al. . |
| 5,119,436 | 6/1992 | Holdgrafer . |
| 5,157,734 | 10/1992 | Chen et al. ............................ 382/153 |
| 5,220,619 | 6/1993 | Keokoek .............................. 382/153 |
| 5,274,713 | 12/1993 | Chang et al. . |
| 5,280,436 | 1/1994 | Kubota et al. . |
| 5,608,818 | 3/1997 | Chini et al. ............................ 382/153 |
| 5,932,323 | 8/1999 | Throssel ............................... 324/758 |
| 5,952,843 | 9/1999 | Vihn .................................... 324/761 |

*Primary Examiner*—Joseph Mancuso
*Attorney, Agent, or Firm*—Renner, Otto, Boissell & Sklar LLP

[57] ABSTRACT

A system for inspecting integrated circuit probe cards using a video camera positioned to view probe points on the cards from below. A precision movement stage is used to move the video camera into a known position for viewing the probe points. Analysis of the video image and the stage position are used to determine the relative positions of the probe points.

22 Claims, 2 Drawing Sheets

INTEGRATED CIRCUIT PROBE CARD INSPECTION SYSTEM

This is a division of application Ser. No. 80/072,206, filed Jun. 4, 1993 now U.S. Pat. No. 5,657,394.

TECHNICAL FIELD OF THE INVENTION

The present invention relates generally to the testing of integrated circuits, and more particularly, to a method and apparatus for testing probe cards which are used to make electrical contact with integrated circuit chips in wafer form.

BACKGROUND OF THE INVENTION

Integrated circuits are fabricated by a series of batch processes in which wafers, typically of silicon or other compatible material, are processed to produce a particular type of integrated circuit. Each wafer contains a plurality of integrated circuits or chips, typically of the same kind. As is known, chemical, thermal, photolithographic and mechanical operations are typically involved in the fabrication of the integrated circuit wafer. Because of variations across the wafer and across each individual chip caused by process variables or physical phenomena, however, not all chips on the wafer will meet the desired specifications for the chips. Some method of testing must be employed to determine which chips on any given wafer meet the specifications.

Integrated circuit chips are typically fabricated with one or more layers of metal interconnect on the surface of the chip which provide connecting paths to form the desired circuit. The metal interconnect layer or layers also provide a means to make connections to the integrated circuit chip when the chip is separated from the wafer and is assembled into a package or carrier. Interconnect points, typically called "bonding pads", are formed by the metal interconnect and are arrayed on the surface of the chip so as to allow small bonding wires or other connecting means to be connected from the integrated circuit chip to its carrier or package. These same bonding pads, and others designed specifically for test purposes, are used to make electrical contact to each individual chip for testing the electrical characteristics of the chips even while still joined together in wafer form.

The yield of good chips on a wafer is defined as the percentage of good dies with respect to the total dies present on the wafer. Yield is the single most important cost factor in the production of integrated circuit devices. Each process and test step may be considered a potential yield loss point. The testing of each die on the wafer may result in yield loss not only from improper earlier processes, but also from problems which can occur due to errors in testing operations. For example, during a probe testing operation electrical contact must be made to the bonding pads of each integrated circuit in order to stimulate electrically the circuit and to measure critical parameters. An array of fine wire probes, conductive bumps and/or fine beams formed on a card is aligned so as to correspond with the array of bonding pads and is used to contact mechanically and electrically the array of bonding pads. Typically, each die on the wafer is sequentially positioned and aligned under the array of probes, for example, and the wafer is moved up to allow contact of the respective probes onto the chip. Precision wafer movement stages allow each chip to be positioned under the probe array, brought into contact with the probe array, and tested. The chips on the wafer which do not pass the electrical test are marked by some method such as by applying a dot of ink or by storing their respective position on the wafer in computer memory for later recall.

In most cases, the interconnecting metal layer or layers of the integrated circuit chip are formed of aluminum or sometimes gold. These metals provide good processing characteristics and good electrical characteristics. However, these metals are also rather soft in comparison with the typical materials used for forming the probes on the card (referred to herein as an integrated circuit probe card). As a result, it is likely that damage to the bonding pad area will occur if the probe card is not properly constructed, aligned, adjusted and utilized. For example, the tips of the probes must be carefully adjusted for planarity to insure that all probes touch the respective bonding pads at relatively the same time. The probes must also be adjusted to contact, e.g., touch down, accurately on each pad. After the probes initially contact the respective bonding pads, a proper amount of overdrive must be maintained past the point of initial contact in order to provide a contacting force resulting in a consistent low resistance contact. The tips of the probes themselves must be capable of providing low resistance contact between the probe and the bonding pads and should be free of contaminants which prevent good electrical contact. The contacting force or spring constant of the probe itself is also a parameter which must be considered in determining the ability of a probe to provide a proper contact.

Various technologies have been used to produce probe cards for testing integrated circuits. The most common types are blade, epoxy ring and membrane technologies. A fourth type, which involves what is referred to a "buckling beam", also has been used by some manufacturers. Blade technology is discussed in U.S. Pat. No. 4,161,692 for a "Probe Device for Integrated Circuit Wafers"; U.S. Pat. No. 3,849,728 for a "Fixed Point Probe Card and an Assembly and Repair Fixture Therefor"; and U.S. Pat. No. 4,382,228 for a "Probes for Fixed Point Probe Cards". Epoxy ring technology is discussed in U.S. Pat. No. 3,835,381 for a "Probe Card Including a Multiplicity of Probe Contacts and Methods of Making", U.S. Pat. No. 3,905,008 for a "Microelectronic Test Probe Card Including a Multiplicity of Probe Contacts and Method of Making Same"; U.S. Pat. No. 4,599,559 for "Test Probe Assembly for IC Chips"; and U.S. Pat. No. 4,757,256 for a "High Density Probe Card". Buckling beam technology is discussed in U.S. Pat. No. 4,554,506 for a "Modular Test Probe"; and U.S. Pat. No. 4,843,315 for a "Contact Probe Arrangement for Electrically Connecting a Test System to the Contact Pads of a Device to be Tested".

The most commonly used type of technology to produce integrated circuit probe cards is epoxy ring technology, although the other technologies are similar. In the construction of an epoxy ring type probe card, a sheet of mylar is punched or drilled with a series of holes in the same array pattern as the bonding pad locations on the chip. The holes are sized to accept the tip of each probe and hold the tip in position during construction of the card. These holes are typically 0.001 inch to 0.002 inch in diameter. Each probe is made from a length of spring wire which is tapered to a point at one end and bent down at a steep angle to form a probe tip. Each probe tip is placed in a corresponding hole in the mylar sheet. The other end of each spring wire probe is arrayed in a generally circular pattern with those of the other probes and is secured in place by a ring of epoxy or another suitable material. The ends protrude through the epoxy in order to be soldered to a circuit board which forms the probe card. After the probes are soldered to the circuit board, the probe tips are sanded to provide relatively flat probe tips positioned in a relatively planar array.

Various systems have been used to inspect the probe cards and, for example, to adjust the probe cards. The critical parameters for probe cards include planarity of the probe tips, contact resistance, electrical leakage from probe to probe and alignment of the probe tips relative to the bonding pads. Other important parameters are probe tip diameter, contact force or spring constant of the probe, and the length of the probe tip. Failure of the probe card to meet the required parameters can result in errors when using the probe card to evaluate chips on a wafer.

Methods for measuring planarity, contact resistance and leakage are known in the art. Alignment of the probe tips has typically been evaluated by way of a visual comparison of the probes to the bonding pad array of the integrated circuit, and more recently, by way of an electrical method described in U.S. Pat. No. 4,919,374 entitled "Method and Apparatus for Inspecting Integrated Circuit Probe Cards" and in U.S. Pat. No. 5,060,371 entitled "Method of Making Probe Cards". The measurement of probe tip diameter, contact force and the length of the probe tips has typically been performed using known manual methods.

Determining the planarity of the array of probe tips is typically accomplished using a flat metal plate held parallel to the surface of the probe card. The probes are then sequentially scanned to determine when contact occurs with the metal plate as the plate is incrementally moved along a Z-axis so as to be brought into contact with the probes. As each probe makes contact, the position of the plate with respect to the surface of the probe card is recorded. Thus, the Z-axis positions of all the probe tips are determined. However, conventional probe card inspection systems offer very little in the way of assistance to the operator for adjusting the heights of the probes to form a more planar array. Moreover, if two or more probes in an array are parallel connected or "bussed" to allow extended current carrying capacity, additional tests must be performed to determine their individual Z-axis positions. A method of isolating individual probes is required to determine when each probe touches the conducting surface. A variety of pins, insulators with holes and conducting dots with surrounding insulator material have been used for this purpose.

Contact resistance of the probe tips can be measured using conventional techniques for the measurement of low resistances. A typical method would be to bring the probe tip into contact with a conducting metal surface and measure the resistance of the resulting interface. After probes are in contact with the contacting metal surface, current is forced, via the multiplexer interface, on each probe and then the subsequent voltage of each probe is measured. The measurement preferably is performed at a known deflection or "overdrive" of the probe after the initial contact with the surface. Since the resistances are typically very small, e.g., on the order of a few tenths of an Ohm, Kelvin measurement techniques are required for accurate measurements. The type of metal used for the contact plate is typically gold and some differences will be observed between the resistance measured by these conventional methods and the actual resistance observed when the probe is contacting bonding pads formed using aluminum metalization, for example, on the integrated circuit chip.

Furthermore, since the aluminum is rather soft in comparison with the probe tip material, the tip of the probe will tend to protrude or "dig" into the aluminum and make contact over a much larger surface area of the tip as compared to on the harder gold surface. The angle of the probe tip relative to the bonding pad is such that a scrubbing motion is created when the tip is driven against the pad. In the case of a bonding pad made of soft aluminum, this creates a scrub mark corresponding to the path of the probe tip on the pad. Accordingly, it will be appreciated that the more that is known about the size and shape of the probe tips and the scrub marks they create, the more complete the understanding of the ability of the probe tip to maintain low contact resistance.

Electrical leakage between probes on the probe card may adversely affect the testing of the integrated circuit. Therefore, it is important to inspect for electrical leakage. Leakage may be measured by applying a potential to each probe in sequence and grounding the remaining other probes, and then measuring the current which flows. However, the test must take into account any bussed probes or components such as resistors, diodes and capacitors which may be permanently connected to the probes and form a part of the probe card. In order to perform a complete inspection of the probe card for electrical leakage, it is necessary to check each probe relative to every other probe to ensure there are no leakage paths.

Conventional inspection systems do not distinguish which tests in a series of different tests should be performed first on the probe card. However, in order to properly test for planarity it is desirable to test first for leakage to avoid incorrect results from probes which have excessive leakage.

The X,Y locations of the probes (corresponding to an X-axis and Y-axis) with respect to the bonding pad locations on the integrated circuit have typically been adjusted using manual means and comparing the X,Y locations to an actual integrated circuit chip or a film representation thereof. The probes, or the scrub marks on the pads, provide the visual comparison for the operator to determine which direction to bend or reposition the probes in order to achieve proper alignment. This alignment task becomes increasingly difficult and prone to operator error with high numbers of probes in a given array. The electrical method disclosed in U.S. Pat. Nos. 4,919,374 and 5,060,371 determines the X,Y positions of the probes by determining the contact point of each probe on orthogonal conducting strips on an insulating material. This technique is only suitable for coarse approximations, however, as the flat shape of each probe tip causes actual the contact point between the probe tip and the conducting strips to be offset from the center of the probe tip. This results in measurement errors which are proportional to the diameter of the probe or the distance thereacross if shaped other than a circle. Also, the technique requires that the probes be brought into contact with the insulating material and conducting strips a very large number of times in order to determine the X,Y positions of all the probes. This can result in excessive wear on the probe tips. For example, because the insulating material is typically ceramic, the probe tips may be abraded excessively and pick up contaminants from the rough ceramic surface.

In view of the aforementioned shortcomings associated with conventional probe card inspection systems, it is desirable to have an inspection system which tests the X,Y locations of the probes on the probe card without requiring an actual wafer or a film representation of the bonding pads. The design information of the pad locations and sizes is typically available in computer readable form before the photomasks or the wafers are produced. It is desirable to import this information directly into the inspection system performing the X,Y location test to avoid errors and to be able to produce a probe card even before wafers are available. It is also desirable that the inspection system be able to determine automatically the proper probe locations and configurations from the photomask used to create pad openings in the protective glass layer over the chip. In addition, it is desirable that the inspection system be able to use a known good probe card for the same purpose when other means are not available.

SUMMARY OF THE INVENTION

Accordingly, it is an object of this invention to provide an integrated circuit probe card inspection system which provides for the automatic inspection of all critical parameters of integrated circuit probe cards. It is a further object of this invention to provide such a system whereby automatic inspection of contributory parameters of integrated circuit probe cards is also provided. It is still another object of this invention to enable the inspecting of probe card parameters even before wafers or art work are available for the specific integrated circuit which is to be tested using the probe card. It is still another object of this invention to provide a system which can determine the proper probe locations and configuration for a probe card from an existing probe card or pad layer photomask.

Furthermore, it is an object of this invention to provide a system for measuring the X,Y coordinate locations of the probe points of an integrated circuit probe card and for comparing the measured locations to the desired locations. Another object of this invention is to provide an inspection system to aid in correcting improperly positioned probe tips. Still another object of this invention is to provide a system for determining the scrub pattern which will be generated by a probe tip when it is positioned onto an integrated circuit. It is still another object of this invention to provide a system for accurately and automatically determining the shape and size of the probe tips. Moreover, it is an object of this invention to provide a system for accurately and automatically determining the length of the probe tip. Even further, it is an object of this invention to provide a system for checking the results of such analysis and adjustments by positioning the probes on an actual integrated circuit chip on a wafer.

These and other objects of the invention are provided by an inspection system according to the present invention for inspecting and adjusting the probes on probe cards of various types, including but not limited to blade, epoxy ring, membrane and buckling beam type probe cards.

According to one particular aspect of the present invention, an integrated circuit probe card inspection system is provided which includes an integrated circuit probe card inspection system for determining the relative location of probes in a probe array, comprising a viewing system providing an image of the tip of each probe in digital form, a window with a flat surface contacted by said probe tip, a computer means with software means to analyze the probe image position within the video image, and positioning means to position the center of the digital image to a known physical position with said probe contact in the field of view.

According to another aspect of the present invention, an integrated circuit probe card inspection system is provided comprising an integrated circuit probe card inspection system for determining the location and length of the scrub mark which would be made by a probe tip on an integrated circuit bonding pad, comprising a viewing system providing an image of the probe tip in digital form, a window with a flat surface contacted by said probe tip, a computer means with software means to analyze the probe tip image position within the video image, and positioning means to position the center of the digital image to a known physical position with said probe tip in the field of view.

According to still another aspect of the present invention, an integrated circuit probe card inspection system is provided comprising a method for determining the location and length of the scrub mark made by a probe on an integrated circuit bonding pad contacted by the probe, said method comprising the steps of capturing a first digitized image at a first defined overdrive, and capturing a second digitized image at a second defined overdrive, then determining the path and form of the scrub mark from the position and size of the two digitized images.

According to still another aspect of the present invention, an integrated circuit probe card inspection system is provided comprising an apparatus for determining the length of a probe tip, comprising contacting means for sequentially contacting the tip and the beam of a spring contact probe, positioning means for controlling X,Y and Z axis movements of said contacting means, measuring means for determining the angle of the scrub mark created by the probe tip upon contact and overdrive against a surface, measuring means for determining the position of the beam portion of the probe from the position of the tip and the angle of the scrub mark, measuring means for determining the vertical height of each contacted point from a known reference, and calculating means for determining the difference in the two measured heights representing the length of the probe tip.

According to still another aspect of the present invention, an integrated circuit probe card inspection system is provided comprising a method for learning the probe tip locations of an existing known good probe card by capturing a digitized image of each probe tip on the probe card, then determining the relative position of each probe tip with respect to the other probe tips on the probe card, then constructing a file of said relative position information for use in determining the correct placement of probe tips on other probe cards of the same type.

According to still another aspect of the present invention, an integrated circuit probe card inspection system is provided comprising a method for determining the orientation and spatial position of an array of probes with respect the test apparatus for determining probe position by positioning the video microscope field of view within the array of probes, and moving in a known direction along the X or Y axis a distance not exceeding the X or Y dimension of the chip corresponding to the probe card, and checking for probes in the field of view, and if no probes are found along the original axis selected, moving along the opposite direction of that axis and along the positive and negative directions of the other axis, no more than the dimension of the chip in that axis, until probes are found, and digitizing the image of any probe tips found by the video microscope, and determining by electrical means which probe of the array is being viewed by the video microscope, and comparing the information thus obtained to the X,Y probe locations of the probe array to determine the orientation of the probe array with respect to the X and Y axes and the location of at least one probe in the array, According to still another aspect of the present invention, an integrated circuit probe card inspection system is provided comprising a method for sanding probe tips to a known extent by determining the vertical height of at least the lowest probe of an array of probes by making contact with a planar metallic surface, and moving the array of probes over a metallic surface sanding area which is co-planar with said planar metallic surface, and moving said metallic surface sanding area until electrical contact is made with the lowest probe in the array, and further moving said metallic surface sanding area into physical and electrical contact with said array of probes to a known amount desired to provide proper sanding.

According to still another aspect of the present invention, an integrated circuit probe card inspection system is provided comprising means for determining the relative locations of bonding pads of an integrated circuit chip, comprising, in combination a photomask of the passivation layer of said integrated circuit, a viewing system providing an image of each bonding pad area of said photomask in digital form, holding means to position said photomask in a known orientation to the viewing system, lighting means to enhance contrast between clear and dark areas of said photomask, computer means with software means to analyze said bonding pad image position within the video image, and positioning means to position the center of the digital image to a known physical position with each of said bonding pads sequentially in the field of view.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE PREFERRED EMBODIMENTS

Figure 1:
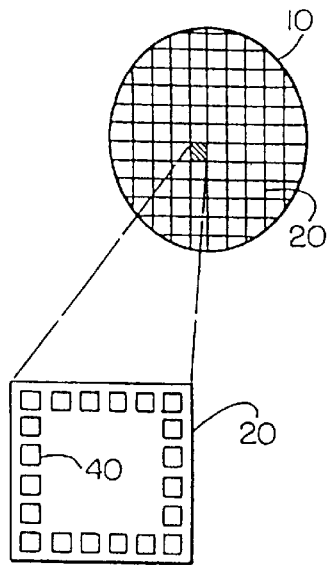
FIG. 1 is a schematic representation of a typical semiconductor wafer including an exploded view of semiconductor chip on the wafer showing the bonding pad areas.

The present invention will now be described with reference to the drawings, wherein like reference numerals are used to refer to like elements throughout.

Figure 2:
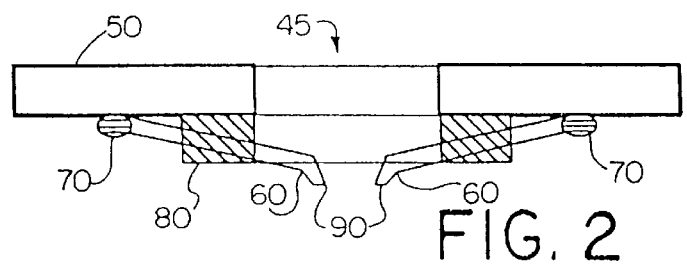
FIG. 2 is a cross-sectional view of a typical integrated circuit probe card.

Referring initially to FIG. 1, a typical semiconductor wafer 10 is shown including a plurality of integrated circuit chips 20. An enlarged view of one of the chips 20 is provided so as to illustrate a plurality of bonding pads 40. In order to determine which chips 20 on the wafer 10 meet the desired specifications, electrical tests are performed on each chip 20 using an integrated circuit probe card (FIG. 2). Electrical contact to the respective chips 20 is made via the respective bonding pads 40. These bonding pads 40 serve the dual purpose of providing connection points for bonding wires (not shown) which provide conducting paths from the chip 20 to its package or carrier, and providing contact points for probes to provide connection to a suitable probe card for electrically testing the chips 20 on the wafer 10.

A typical probe card 45 for testing integrated circuit chips 20 in wafer form is shown in FIG. 2. The probe card 45 includes a printed circuit board 50 to which are attached a plurality of fine wire probes 60. These probes 60 are typically attached to traces on the printed circuit board 50 by solder connections 70. The tips of the probes 60 are designated 90 and are arrayed in a pattern to match the bonding pad configuration of the chip 20 to be tested. The probes 60 are held in their particular configuration by an epoxy or ceramic ring 80 as mentioned above. The fine wire probes 60 are typically formed of tungsten, beryllium copper or another suitable metal. The tips 90 of the probes 60 are typically from 0.0005 inch to 0.003 inch in diameter. The tips 90 must be carefully positioned to contact the bonding pads 40 (FIG. 1) in such a way as to provide reliable contact to the respective pads 40. The configuration of the probes 60 is such that as the probe tips 90 are pressed against the bonding pads 40, some lateral motion of the tip across the pad 40 called "scrubbing" occurs. If all of the probe tips 90 were in exactly the same horizontal plane parallel to the printed circuit board 50, this scrubbing contact action on the pads 40 would be very predictable and repeatable. Because of the physical processes required to construct the probe card 45, however, the probe tips 90 will not be perfectly planar with respect to the surface of the printed circuit board 50 or the surface of the chip 20 on which the bonding pads are located. If the probe tips 90 are sufficiently out of planarization (i.e., out of a planar state), the scrubbing action of the lower positioned probe tips 90 may cause those probe tips 90 to travel off of the respective pads 40 before the higher positioned probe tips 90 make contact with the pads 40. Similarly, the probe tips 90 will not be perfectly aligned to make contact in exactly the same spot on all pads 40. Misalignment of the probe tips 90 with the pads can cause the tip to miss the pad 40 and/or possibly damage the protective oxide layer which surrounds the pad 40. As a result, it is necessary to planarize (i.e., make planar) the probe tips 90 and adjust their position to properly contact the pads 40 in order to assure reliable contact for testing.

Figure 4:
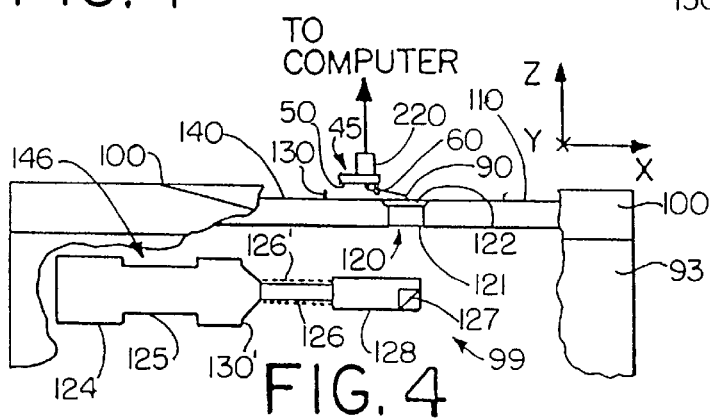
FIG. 4 is a cross-sectional view of the wafer chuck and the associated CCD camera and lensing apparatus according to the present invention.
Figure 8:
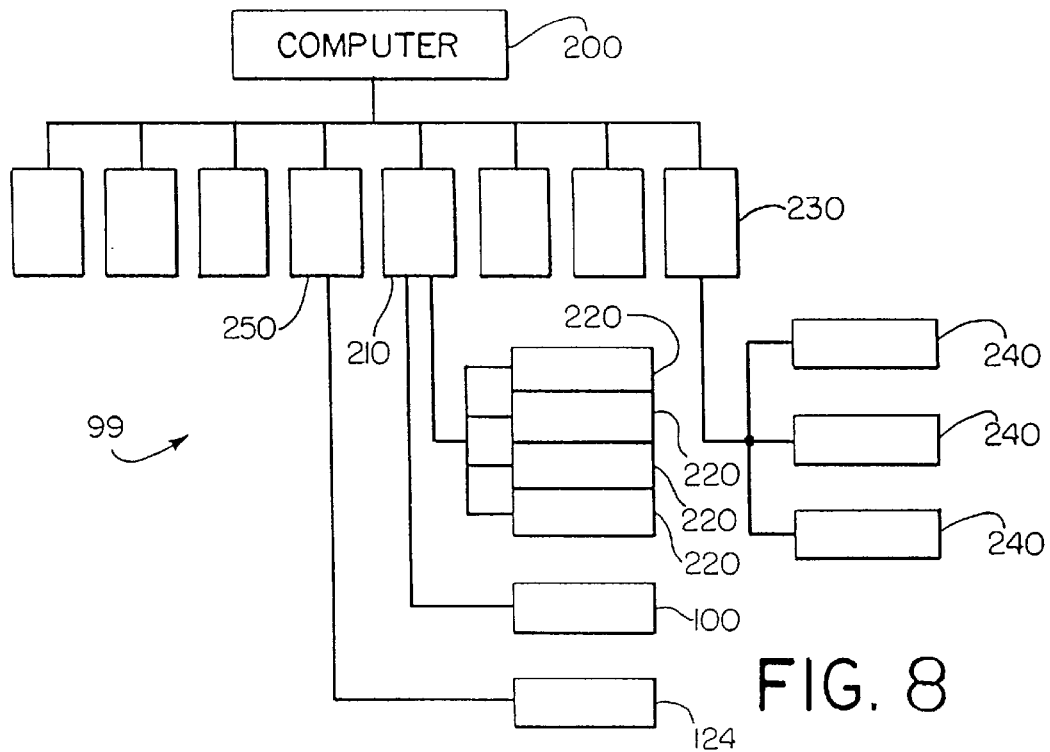
FIG. 8 is a block diagram representation of the computer and electronics used to control the movable stage, video system and measurement system according to the present invention.

Referring now to FIGS. 4 and 8, the system of the present invention, designated 99, includes a movable stage 93 which provides accurate, computer controlled motion in the X,Y,Z and theta (θ) directions. A wafer chuck 100 is mounted to the stage 93 and includes a planarizing surface 110 for determining the planarity of the probe tips 60, a viewing window 120 flat and parallel to the planarizing surface 110 which enables a video camera to view the probe tips, a bus pin probe 130 for isolating common or bussed probes, and an area including a sanding media 140 for cleaning probe tips 90.

The system 99 includes a video camera 124 to view the probe tips 90 from beneath the probe card 45 to determine X,Y alignment. The probe card 45 is fixedly positioned relative to the stage 93 above wafer chuck 100. The camera 124 moves with the X,Y and Z motion of the stage 93 and is positioned so that the viewing port of the camera 124 is in the center of the wafer chuck 100. A lens system 126 with coaxial lighting is connected to the camera 124 and the combination is mounted horizontally under the wafer chuck 100. A right angle prism 127 directs the horizontal view of the camera 124 through the lens system 126 up through the viewing window 120 at the center of the wafer chuck 100. The viewing window 120 in the surface of the wafer chuck 100 provides a surface 122 for exerting a driving force on the probe tips 90 under observation to the desired level of overdrive for viewing by the video system. As the stage 93 raises the surface 122 incrementally in the Z-direction towards the probe tips 90, the surface 122 presses against the probe tips to exert the driving force. The video camera 124 is focused just above the top surface 122 of the window 120 where the probe tip under test is located. A combination of top and bottom lighting of the probes 60 is preferred to view the probe tips 90 to determine X,Y position, size, shape and condition.

Video images obtained by the video camera 124 are captured in a computer using a video processing board which stores digital representations of the video images of the probe tips. Depending on the density (pitch) of the probe card 45, one or more probe points are captured in each image. After each image is captured, it is analyzed using image analysis techniques to determine the position of the centroid of each probe tip 90 in the image. Since the position of the pixels of the image with respect to the position of the stage is known (from system calibration), the X,Y position of each probe tip 90 may be determined. The image of each probe tip 90 in the array is preferably captured and its position determined in this manner. It is particularly desirable to capture the image of the probe in the desired overdrive condition. This overdrive condition creates special problems with regard to common or bussed probes, and the inspection system 99 provides a means for analyzing bussed probes as is discussed in detail below.

As is described in more detail below with respect to FIG. 3, a surface portion 110 of the wafer chuck 100 is smooth and flat with gold plating thereon to provide a planarization area which is electrically conductive. A bus probe pin 130 is extended through the wafer chuck 100 outside the planarization area 110 for use when analyzing bussed probes. The pin 130 may be retracted below the surface of the chuck 100 to allow a wafer to be placed on the chuck 100. In the center of the chuck 100 is the viewing window 120 for the video camera 124 which allows a computer to capture images of the probe tips. These images in combination with the X,Y,Z positions of the stage 91 provide the information necessary to determine the position of each of the probe tips. The viewing window surface 122 is in the same plane as the surface of the planarization area 110 of the chuck so that a known deflection can be applied to the probes as they are driven against the viewing window surface 122. The window surface 122 is constructed of a hard, transparent material such as sapphire which will not be scratched or damaged by the probe tips.

Measurement circuitry and multiplexers allow each probe in the array to be electrically stimulated and measured under control of the computer as is described below in more detail with respect to FIG. 8. A single computer may be used to provide control of the stage assembly, measurement circuitry and multiplexers as well as providing a user interface to the operator. However, it will be appreciated that multiple computers can be provided to carry out the same tasks.

The sequence of analysis is also important to the proper analysis of a probe card 45. The electrical leakage test preferably is performed first to eliminate the possibility of low resistance paths effectively shorting probes together. Otherwise, if the planarization test were attempted with two or more probes unintentionally shorted together, any one of the shorted probes touching the chuck surface 110 would be recorded as a touch for all of the group of shorted probes and false Z values would be recorded for the others.

Referring again to FIG. 4, the planarization test preferably is performed next in the sequence in order to know the vertical or planar position in the Z-direction of each probe with respect to the chuck 100. This data is then used to deflect each probe to the proper overdrive condition in order to find each probe's X,Y position in the overdrive condition. As an example, the lowest positioned probe in the array (relative to the Z-axis), i.e., the probe to first contact the planarization area as the chuck surface 100 approaches the probe card 45, is found and overdrive values determined from its position. To perform the planarization test a ground potential is placed on the chuck surface 110. The probe card 45 is fixtured in a holder to be above and parallel to the chuck with the probe tips facing downward toward the chuck. Multiplexed measurement circuitry described with respect to FIG. 8 provides access to each probe 60 for electrical stimulus and measurement. The chuck 100 is incrementally raised via the stage 93 and the array of probes is scanned with a positive voltage at each step to determine when each probe 90 touches the chuck surface 110, thus making contact to ground and causing a current flow which is detected. The Z-axis position of the stage 91 is recorded for each touch of a probe 60, thus defining the Z height of each probe 60. This Z height can be easily referenced to the surface of the probe card 45 by calibrating the Z position of the stage to the holding fixture (not shown) for the probe card. A "best fit planar line" is established at the Z height representing the maximum density of probes, such that for a given planarization specification, the fewest number of probes 60 would have to be adjusted to fall within the planar window. The planar window is defined as limit values equally spaced around the planar line.

If there are bus connected probes 60 on the probe card 45, only the position of the lowest probe of any bussed group is recorded by the aforementioned planarization test. In order to determine the individual heights of the bussed probes, they must be individually contacted. The small diameter pin 130, raised above the surface of the chuck 100 is positioned beneath the bussed probes and is used to contact selectively a single pin at a time in the group. In order to perform this test, however, it is necessary to know the X,Y positions of the probes 60 in the bussed group. Therefore, the next step in the inspection procedure is to determine the position of each non-affected probe by the video system described above. Each independent probe, i.e., each probe that is not bus connected, may be driven to a specified overdrive as its vertical position is known exactly. The probes which are bus connected, or which have resistor or capacitance connections, may also be located, but the exact overdrive position is unknown at this point. After the X,Y position of these probes is known, however, they may be individually tested using the bus probe pin 130 as described below to determine their exact planar position, then retested for exact X,Y position at the proper overdrive position.

Since the array of probes 60 may be presented to the present system in any orientation relative to the θ position of the chuck 100, and the video camera 124 and the related optical means have no way of distinguishing which probe 60 is being tested, a method according to the present invention is used to identify orientation of the array and each individual probe. If it is assumed that the viewing window 120 is placed anywhere within the array of probes at the start of the test, i.e, below at least one probe 60, the system 99 can automatically determine the required information. "Stepping" or movement of the stage 91 in any direction, up to a distance equal to the array size, must encounter probes 60. When a probe or probes is found via the video camera 124, the system 99 records the position or positions. At this point, it is still not known specifically which probe or probes have been found. However, because the position of a probe or probes known to be in the array is now known, the identity of any or all of the probes may be determined by contact with the bus probe 130 to identify the probe by its electrical connection in the matrix. If a bus or common probe is selected, the procedure must be continued until an individual probe is found. The known position of one individual probe plus the specified position data of the probes in the array is sufficient to determine the orientation and expected positions of all the probes.

When the system 99 has established absolute X,Y position data for all probes 60 in the probe card 45, the next step is for the system to evaluate the relative positions of each probe to all others. A simple approach is to use one probe as a reference (such as a probe pin 1) and to determine proper relative position for all other probes with reference to that probe. However, this can result in serious complications if the reference probe itself is improperly positioned. In order to assure that the minimum number of probes 60 that need be adjusted to bring the relative positions of the entire array of probes into specification, a best fit analysis is made on the array of bonding pads 40 (FIG. 1) to be contacted. This is done by the computer using matrix techniques which mathematically move the array of measured X,Y probe positions around to match as closely as possible the X,Y pad locations (which are known form the chip 20 design) for best fit. It is then determined which probes are not properly aligned to the pads, per the specification, and those probes are selected for further analysis and adjustment.

By finding the locations of the probe tips at zero overdrive and at a specified nonzero overdrive, the difference in the two locations can be calculated to determine the path and length of the scrub mark created by the probe as is discussed below with respect to FIGS. 6(*a*)–6(*c*). The angle of this scrub mark may also then be used to determine the angle of the probe beam with respect to the X or Y axis.

In order to determine the length of the probe tip, the difference in height of the tip 90 of the probe and the beam of the probe 60 immediately prior to the bend must be found. The bus probe pin 130 may be used to find these two heights by alternately positioning it under the tip of the probe, finding the Z height, then positioning it under the beam, finding the Z height, and then calculating the difference between the two heights as is described below with respect to FIGS. 7(*a*) and 7(*b*). The proper X,Y location for the second measurement is found by using the angle of the scrub mark as described above.

Figure 9:
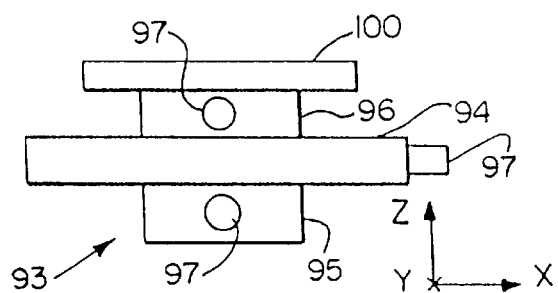
FIG. 9 is a representation of a movable stage assembly including a wafer chuck according to the present invention.

Referring briefly to FIG. 9, the movable stage assembly 93 is shown in detail. The chuck 100 is mounted to the standard X,Y,Z stage assembly 93. As is shown, the Y-axis movement section 95 is on the bottom, extending away from the viewer as seen in FIG. 9. The X-axis movement section 94, which moves left and right with respect to the drawing, is mounted on top of the Y-axis movement section 95. The Z-axis movement section 96 moves up and down relative to the drawing and is mounted on top of the X-axis movement section 94. The three axes of motion X,Y,Z may be driven with standard stepper or servo motors 97.

Referring now to FIG. 8, the stage 93 is controlled by a computer 200 via a motor controller card 230 and motor drivers 240 which drive each of the motors 97, respectively. The arrangement of the computer 200 is such that software control of the stage 93 allows accurately positioning of the chuck 100 in the X,Y,Z directions as required for testing the probe card 45. Known programming techniques such as those used with computerized milling machines can be used to provide the appropriate computer control as will be appreciated. As a result, detail on the computer software is omitted.

The computer 200 is interfaced with special peripheral driver cards as is shown. These special peripheral driver cards include a video image capture card 250, an analog measurement card 210, and the aforementioned motor controller card 230. The video image capture card 250 interfaces the video camera 124 to the computer 200 to provide digital representations of the video images obtained by the video camera 124. The video camera 124 can be, for example, a charge-coupled device (CCD) camera. The analog measurement card 210 provides electrical stimuli and measurement capabilities to force and to measure voltages and resistances relative to the probes 60. Multiplexer cards 220 each selectively provide a connection path between the analog measurement card 210 and each probe 60 of the probe card 50 under the control of the computer 200 via the analog card 210. The analog measurement card 210 is also connected to the chuck 100, and particularly to the conductive surface 110 and the bus probe pin 130 to complete the electrical measurement path for planarity and contact resistance measurements. The motor controller card 230, as is mentioned above, provides an interface to control the stepper or servo motors 97 driving the X,Y and Z axes of the stage 93 FIG. 9). Each motor is interfaced to the motor controller card 230 via standard motor drivers 240 specific to the type motor which is used as is conventional.

Figure 3:
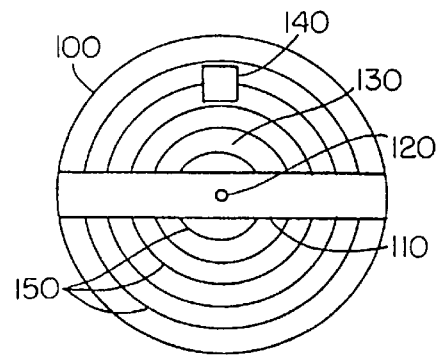
FIG. 3 is a top view of a combination wafer chuck and testing surface according to a preferred embodiment of the present invention.

Referring to FIG. 3, the chuck 100 is shown in detail. As mentioned above, the chuck 100 includes a flat parallel surface 110 which is electrically conductive and is provided to allow testing the planarity of the probe tips 90. A viewing window 120 in the center of the chuck 100 provides for viewing the probe tips 90 with the video camera for the purpose of determining the X,Y coordinate locations of the probe tips 90. The bus probe pin 130 is provided to allow isolating individual probe tips 90 which are connected together (i.e., bussed) in a common electrical network. The pin 130 is also used to measure the vertical force or spring constant of each probe 60 as it is driven against a surface. This measurement provides an indication of the amount of force applied by the probe tip 90 to the pad 40 of the integrated circuit chip 20 during the wafer probe operation. In addition, a small area sanding plate 140 is provided on the chuck 100 for the purpose of removing contamination from the probe tips 90 during testing so as to provide better contact surfaces on the probe tips 90 and brighter tips 90 for viewing by the video system. The chuck 100 is also equipped with vacuum port grooves 150 to hold down a wafer 10 on the chuck 100. This feature may be used to confirm the results of any testing and adjustments by allowing the user to contact the probe tips 90 to the bonding pads 40 and observe the scrub marks formed in the relatively soft pad metalization for proper X,Y positioning and length of the scrub mark.

If the probe card 45 is positioned over the flat surface 110 of the chuck 100 such that the printed circuit board 50 is parallel to the surface 110 as is shown in FIG. 4, a conducting plane formed by the flat surface 110 exists to determine the relative planar positions of the probe tips 90. The chuck 100 and consequently the flat surface 110 is incrementally moved via the movable stage 93 into contact with the probe tips 90. For clarity, a portion of the movable stage 93 has been omitted from FIG. 4. At each increment, the probe tips 90 are individually checked electrically for contact with the flat surface 110 via the analog measurement card 210 and the multiplexer cards 230. As contact is found with any probe tip 90 (noted by the detection of current flow, for example), the vertical position of the chuck 100 (relative to the Z-axis) is recorded by the computer 200. When all probe tips 90 have been located in this manner, or the maximum desired overdrive position beyond the first contact found is achieved, the process is terminated and the relative vertical height data of the probe tips 90 with respect to each other is obtained. This information may then be used to determine how much and in which direction the individual probes 60 should be adjusted by bending them up or down in order to be uniform in height or planar position. The Z-axis movement section 96 (FIG. 9) must be sufficiently accurate and have fine enough step resolution to map the vertical positions of the probe tips 90 to the required degree of accuracy. For present technology, this resolution and accuracy is on the order of 1.0 to 3.0 micrometers. The probe tips 90 are typically adjusted to be coplanar within 10 to 25 micrometers.

Figure 5:
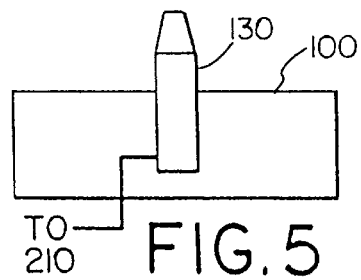
FIG. 5 is a cross-sectional view of a portion of the wafer chuck including the bus probe pin according to the present invention.

When the probes 60 are connected to a common node, or bus connected, the method described above will only find the lowest positioned probe tip 90 in the bus connected group. Each probe tip 90 in the group must then be electrically isolated from others in the group in order to find its height. This is accomplished by using the bus probe pin 130 in its raised position as is shown in FIG. 5 to isolate a probe tip 90 and to individually contact it to the chuck 100. The height of the bus probe pin 130 (relative to the Z-axis) may be calibrated to be a known height above the surface 110 in its raised position, thus providing a known height for the measured probe tip 90 relative to all other probe tips 90. FIG. 5 shows the relative position of the bus probe pin 130 with respect to a portion of the wafer chuck 100. Because the bus probe pin 130 is electrically connected to the analog measurement card 210, the pin 130 can be held at a ground potential in the same manner as the surface 100. Thus, when the bus probe pin 130 contacts a particular probe pin 60 selected by the multiplexers 220 and having a positive potential applied thereto, such contact is identified by the detection of current flow by the analog measurement card 210.

The bus probe pin 130 also has another very important use in the present invention. Referring to FIG. 4, a cross section of the chuck 100 is shown including the video window 120 area. The video window 120 includes a hole 121 through the chuck 100 and a sapphire window 122 within the hole 121 which is coplanar with the surface 110 of the wafer chuck 100. The video system 146 which is integral with the chuck 100 and moves with it via the stage 93, includes the video camera 124 coupled to an optical microscope 125 with a small diameter lens system 126 and focusing mechanism 130'. The lens system 126 includes a fiber optic light guide 126' (shown in phantom) which is coaxially arrayed around the outside of the lens system 126 to provide sufficient light directed onto the probe tips 90 via a right angle prism 127. The image of the tip of a probe 60 or probes directly above the window 120 is directed at right angles to the lens system 126 by the right angle prism 127. A holding mechanism 128 allows the system to be adjusted so that the view of an object through the window 120, in the illustrated case the tip of a probe 60, is centered relative to the lens system 126. The focus mechanism 130' allows the optical microscope 125 to be focused accurately on the surface of the sapphire window 122, hence on the tip 90 of the probe 60. The video output of the video camera 124 is provided to a commercially available image capture card 250 such as that available from Volant Systems, Inc. (Model No. 2510) operating in the computer 200. The computer 200 can be a personal computer. Blob analysis software running on the computer 200 to control the image capture 250 is used to determine the position of image of the probe tip 90 on the video field of view. Since the X,Y position of the chuck 100 and window 120 may be determined from the position of the stage 93 which includes stepper or servomotor control and linear position encoders, the position of the probe tip 90 can be determined. When the X,Y position of a probe tip 90 is determined by the video system 146, the bus probe pin 130 is used to identify which probe tip 90 has been located. This is accomplished by contacting the located probe tip 90 with the bus probe pin 130 and checking all possible probe tips 90 for contact with the pin 130 via the analog measurement card 210 and multiplexers 220 to determine which probe tip 90 is being contacted. Once a pattern has been established, the system can identify probe tips 90 strictly by their positions based on comparison to the known X,Y positions of probe tips 90 in the array.

Referring still to FIG. 4, the sequence in which the various operations are performed is a particular feature of the subject invention. The first step is to place the probe card 45 in a known area so that the inspection system 99 may locate the array of probes 60 through the window 120 with the video system 146. The preferred method is to move the stage 93 such that the video window 120 is positioned somewhere directly beneath the array of probes 60. The control software for the computer 200 is written to automatically perform the required operations to determine X, Y, and Z locations of all the probe tips 90 based on the blob analysis software. The inspection system 99 then checks for electrical leakage or shorts between each probe 60 and all other probes 60. This assures that all electrical measurements to determine probe identities will give accurate results. The next step is to determine the lowest probe tip 90. At this time, the height of all the non-bus-connected probes 90 may be determined relative to the Z-axis as described above along with their contact resistance as measured between the surface 110 of the chuck 100 and the probe tip 90. This is accomplished by moving the stage 93 such that the array of probes 60 is over the flat parallel surface 110 of the chuck 100 and offset from the video window 120. After this is complete, the video window 120 can be automatically returned to its position within the array of probes 60. By searching alternately in the X or Y direction to a distance not exceeding the X or Y dimension of the chip 30 for which the probe card 50 is designed, the video system 146 must encounter probe tips 90 in its field of view. Once a probe 90 is found, it must be identified. This is accomplished as explained above by the use of the bus probe pin 130. If the identified probe 90 in not a bus probe 90, i.e., the probe 90 is electrically isolated, it may be identified uniquely. If a bus probe 90 is found, the procedure must be continued until a known unique probe 90 is located. Comparison to information on the array of probes 60 and positions of the probe tips 90 stored in the computer 200, the orientation of the array relative to he chuck 100 may be determined. The procedure can then continue to locate the probe tips 90 with the video system and for bus probes 90, determine their individual Z-axis heights and contact resistances using the bus probe pin 130.

Figures 6A, 6B, 6C:
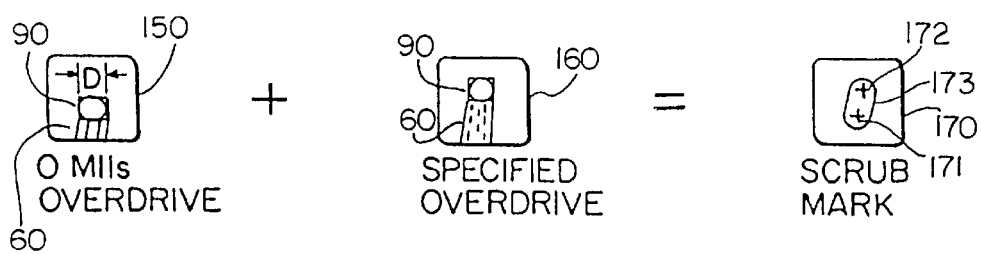
FIGS. 6(a)–6(c) are schematic views of video images of probe tips at zero overdrive and at the specified overdrive, and a combined view representing the scrub mark created by the probe, respectively, in accordance with the present invention.

Referring to FIGS. 6(a)–6(c), typical views of a probe tip 90 as seen by the video system 146 are shown. In the first video image 150 shown in FIG. 6(a) a probe tip 90 is shown as it would initially contact the video window 122 without being deflected or overdriven (i.e., the zero overdrive position). Since the probe 60 X,Y positions are normally specified at a known overdrive, the Z-axis height of the chuck 100 is moved up from the height at which initial contact occurred in order to deflect the probe 60 to the specified overdrive as shown in the second video image 160 illustrated in FIG. 6(b). The system 99 may compare the locations for each probe 90 as found in the overdriven position of the second video image 160, or may calculate the path of the probe 90 as it traverses over the surface as in the superimposed video image 170 represented in FIG. 6(c). The difference in location between zero overdrive position 171 and the specified overdrive position 172 as identified by the computer 200 is used by the computer to determine the equivalent of a scrub mark 173 which would be made by the probe tip 90 on the relatively soft metal of an integrated circuit bonding pad 40 (FIG. 1). The specifications on the array of probes 60 may be written to require that the position of a given probe tip 90 in the overdriven case or that the equivalent scrub mark 173 be within specified locations relative to the respective bonding pad 40 of the integrated circuit chip 20. The computer 200 processes the image data obtained from the video system 146 to evaluate compliance with such specifications.

The image of the probe tip 90 as viewed by the video system 146 may also be used to determine the diameter D (FIG. 6(a)) of the probe tip 90. As previously mentioned, each wire from which the probes 60 are made is typically tapered at one end to form the probe tip 90. As the end of the tip 90 wears or "dulls", the diameter of the probe tip 90 increases. Specifications may be placed on maximum probe tip 90 diameter to determine when a probe card 50 should be replaced. Again, the computer 200 is used to process the image data as shown in FIG. 6(a) using conventional techniques to determine if the probe tips 90 meet the desired specifications.

Figure 7A:
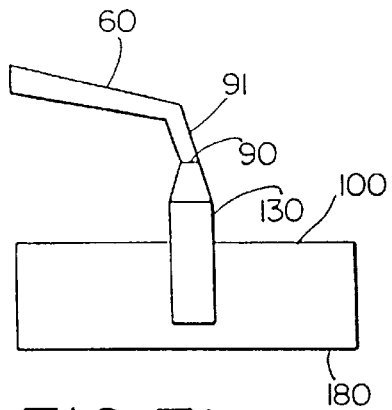
FIGS. 7(a) and 7(b) are cross-sectional views of a portion of the wafer chuck including the bus probe pin shown contacting the tip and subsequently the beam or shank of a probe, respectively, according to the present invention.
Figure 7B:
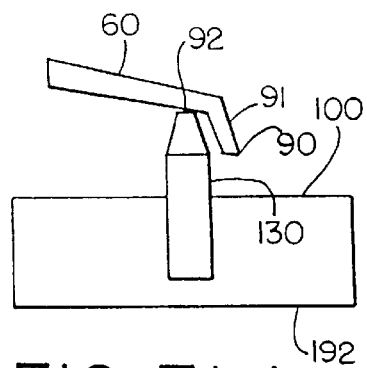

In FIG. 7(a) there is illustrated the condition where a probe tip 90 is placed in contact with the bus probe pin 130 via the stage 93 for the purpose of finding the length of the probe tip 90 in the Z direction. As is known, as the probe tips 90 are used to contact the metalized bonding pads 40 of the integrated circuits 20, the probe tips 90 wear down from the abrasion with the oxides on the metal surface. This shortens the length of the tip area 91 and eventually renders the probe card 45 unusable. A good indication of the wear on the probe tips 90 is a measurement of the length of the tip section 91. FIG. 7(b) shows the bus probe tip 130 being used to contact the shank area 92 of the probe. The angle of the scrub mark 173 created by the probe tip 90 may be used to determine the position of the shank area 92 of the probe 60 with respect to the probe tip 90. The difference in height in the Z direction from the probe tip 90 to a position on the shank 92 is used by the computer to determine the length of the probe tip section 91 and can be computer by the computer 200. Specifications on minimum probe tip section 91 length may be used to determine when a particular probe card 50 should be replaced.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. An integrated circuit probe card inspection system for determining the location and length of a scrub mark which would be made by a probe tip on an integrated circuit bonding pad, comprising:
   a viewing system for providing a digital image of the probe tip,
   a window with a flat surface contacted by said probe tip, said viewing system obtaining said digital image through said window in a first state where said probe tip is driven in contact with said window with a first force, and in a second state where said probe tip is driven in contact with said window with a second force, said second force being different from said first force,
   a computerized means with software means to analyze the position of the probe tip within the digital image in said first and second states, and for determining the location and length of the scrub mark based on said positions.

2. An integrated circuit probe card inspection system according to claim 1, wherein the computerized means analyzes the scrub mark to evaluate compliance with a predefined specification.

3. An integrated circuit probe card inspection system according to claim 1, wherein the first force represents a substantially zero overdrive condition and the second force represents a non-zero overdrive condition.

4. A method for determining the location and length of scrub mark which would be made by a probe on an integrated circuit bonding pad contacted by the probe, said method comprising the steps of:
   capturing a first digitized image at a first defined overdrive, and
   capturing a second digitized image at a second defined overdrive, then determining the path and form of the scrub mark from the position and size of the two digitized images.

5. A method according to claim 4, further comprising the step of analyzing the scrub mark to evaluate compliance with a predefined specification.

6. A method according to claim 4, wherein the first defined overdrive represents a substantially zero overdrive condition and the second defined overdrive represents a non-zero overdrive condition.

7. An integrated circuit probe card inspection system comprising:
   a deflection surface;
   a driving device which drives a probe tip into contact with the deflection surface at a first force and a second different force;
   a location-determining device which determines a first location of the probe tip when it is driven into contact with the deflection surface at the first force and a second location when it is driven into contact with the deflection surface at the second force; and
   a processing device which, based on said first and second determined locations of the probe tip, predicts the location of a scrub mark that would be made by the probe tip on an integrated circuit bonding pad based on the determined first and second locations of the probe tip.

8. An integrated circuit probe card inspection system as set forth in claim 7 wherein the location-determining device comprises a viewing device that obtains a first image of the probe tip when it is driven into contact with the deflection surface at the first force and a second image when it is driven into contact with the deflection surface at the second force;

and wherein the processing device predicts the location of the scrub mark based on a comparison of the first and second images.

9. An integrated circuit probe card inspection system as set forth in claim 8 wherein the viewing device comprises a video camera that obtains video images and a video processing board which stores digital representations of the video images.

10. An integrated circuit probe card inspection system as set forth in claim 9 further comprising a viewing window for the video camera and wherein the window includes the deflection surface.

11. An integrated circuit probe card inspection system as set forth in claim 10 wherein the processing device predicts the path of the scrub mark.

12. An integrated circuit probe card inspection system as set forth in claim 11 wherein the processing devices predicts the length of the scrub mark.

13. An integrated circuit probe card inspection system as set forth in claim 12 wherein the precessing device predicts the angle of the scrub mark.

14. An integrated circuit probe card inspection system as set forth in claim 11 wherein the processing device additionally evaluates compliance of the predicted scrub mark with a predefined specification.

15. An integrated circuit probe card inspection system as set forth in claim 11 wherein the first force represents a substantially zero overdrive condition and the second force represents a non-zero overdrive condition.

16. An integrated circuit probe card inspection method comprising the steps of:

predicting the location of a scrub mark which would be made by a probe tip on an integrated circuit bonding pad contacted by the probe tip; and evaluating the predicted location of the scrub mark for compliance with a predefined specification;

wherein said predicting step comprises the steps of:

driving the probe tip into contact with a surface at a first force;

driving the probe tip into contact with the surface at a second different force;

determining the location of the probe tip when it is driven into contact with the deflection surface at the first force;

determining the location of the probe tip when it is driven into contact with the deflection surface at the second force; and predicting the location of the scrub mark based on the two determined locations.

17. A method as set forth in claim 16 wherein said determining steps comprise capturing a first image of the probe tip during the first driving step and capturing a second image of the probe tip during the second driving step and wherein said predicting step includes comparing the two images to determine the location of the predicted scrub mark.

18. A method as set forth in claim 17 wherein said capturing steps include obtaining video images and processing and storing digital representations of the video images.

19. A method as set forth in claim 18 wherein said step of predicting the location of the scrub mark includes predicting the path of the scrub mark.

20. A method as set forth in claim 19 wherein said step of predicting the location of the scrub mark includes predicting the length of the scrub mark.

21. A method as set forth in claim 16 wherein said step of predicting the location of the scrub mark includes predicting the angle of the scrub mark.

22. A method as set forth in claim 16 wherein the first driving step represents a substantially zero overdrive condition and wherein the second driving step represents a non-zero overdrive condition.

* * * * *

(12) EX PARTE REEXAMINATION CERTIFICATE (8209th)
United States Patent
Schwartz et al.

(10) Number: US 6,118,894 C1
(45) Certificate Issued: May 10, 2011

(54) INTEGRATED CIRCUIT PROBE CARD INSPECTION SYSTEM

(75) Inventors: Rodney E. Schwartz, Tempe, AZ (US);
Glenn M. Wirick, Phoenix, AZ (US);
Gary B. Rogers, Mesa, AZ (US)

(73) Assignee: Integrated Technology Corporation, Tempe, AZ (US)

Reexamination Request:
No. 90/009,515, Jul. 27, 2009
No. 90/009,732, Apr. 26, 2010

Reexamination Certificate for:
Patent No.: 6,118,894
Issued: Sep. 12, 2000
Appl. No.: 08/784,560
Filed: Jan. 21, 1997

Related U.S. Application Data

(62) Division of application No. 08/072,206, filed on Jun. 4, 1993, now Pat. No. 5,657,394.

(51) Int. Cl.
*G01R 1/073* (2006.01)
*G01R 31/28* (2006.01)
*G01R 3/00* (2006.01)

(52) U.S. Cl. .............. 382/151; 324/750.23; 324/758.04
(58) Field of Classification Search .................. None
See application file for complete search history.

(56) References Cited

U.S. PATENT DOCUMENTS

| | | | |
|---|---|---|---|
| 4,035,723 A | 7/1977 | Kvaternik | |
| 4,520,254 A | 5/1985 | Steiger et al. | |
| 4,786,867 A | 11/1988 | Yamatsu | |
| 4,929,893 A | 5/1990 | Sato et al. | |
| 5,065,092 A | 11/1991 | Sigler | |
| 6,118,894 A | 9/2000 | Schwartz et al. | |

FOREIGN PATENT DOCUMENTS

| | | |
|---|---|---|
| JP | S60-18929 | 1/1985 |
| JP | 5-166892 | 7/1993 |
| WO | 92/08144 | 5/1992 |

OTHER PUBLICATIONS

Semicon/West 91, "Program Directory and Product Guide" (3 pages), May 21–23, 1991.
McNair, Fax from Rucker & Kolls to TCL ated Jul. 12, 1991 (3 pages).
Fredriksen et al. New Frontiers in Testing. Copyright 1988. 9 pages. Published by Computer Society Press.

*Primary Examiner*—Christopher E Lee

(57) ABSTRACT

A system for inspecting integrated circuit probe cards using a video camera positioned to view probe points on the cards from below. A precision movement stage is used to move the video camera into a known position for viewing the probe points. Analysis of the video image and the stage position are used to determine the relative positions of the probe points.

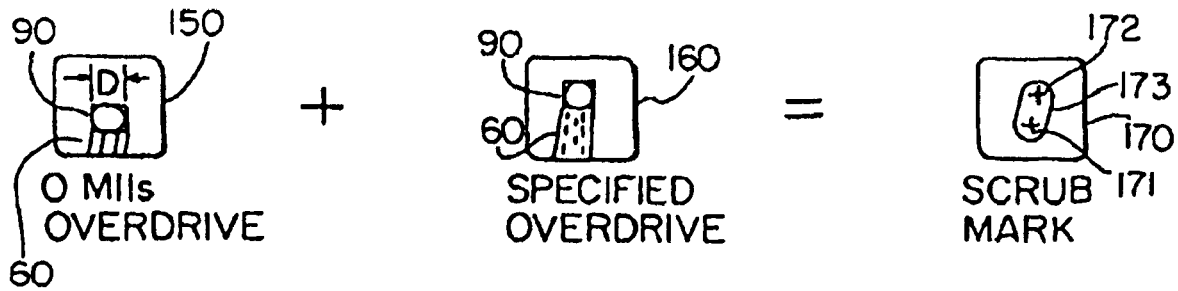

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-22 is confirmed.

New claims 23 and 24 are added and determined to be patentable.

*23. The integrated circuit probe card inspection system according to claim 1, wherein the computerized means determines a path of the scrub mark from the digital image in said first and second states.*

*24. The integrated circuit probe card inspection system according to claim 1, wherein the computerized means determines an angle of the scrub mark.*

* * * * *

(12) EX PARTE REEXAMINATION CERTIFICATE (9843rd)
United States Patent
Schwartz et al.

(10) Number: US 6,118,894 C2
(45) Certificate Issued: Sep. 16, 2013

(54) INTEGRATED CIRCUIT PROBE CARD INSPECTION SYSTEM

(75) Inventors: Rodney E. Schwartz, Tempe, AZ (US); Glenn M. Wirick, Phoenix, AZ (US); Gary B. Rogers, Mesa, AZ (US)

(73) Assignee: Integrated Technology Corporation, Tempe, AZ (US)

Reexamination Request:
No. 90/011,488, Mar. 11, 2011

Reexamination Certificate for:
Patent No.: 6,118,894
Issued: Sep. 12, 2000
Appl. No.: 08/784,560
Filed: Jan. 21, 1997

Reexamination Certificate C1 6,118,894 issued May 10, 2011

Related U.S. Application Data

(62) Division of application No. 08/072,206, filed on Jun. 4, 1993, now Pat. No. 5,657,394.

(51) Int. Cl.
*G06K 9/00* (2006.01)

(52) U.S. Cl.
USPC .................. 382/151; 324/750.23; 324/758.04

(58) Field of Classification Search
None
See application file for complete search history.

(56) References Cited

To view the complete listing of prior art documents cited during the proceeding for Reexamination Control Number 90/011,488, please refer to the USPTO's public Patent Application Information Retrieval (PAIR) system under the Display References tab.

*Primary Examiner* — Michelle Tarae

(57) ABSTRACT

A system for inspecting integrated circuit probe cards using a video camera positioned to view probe points on the cards from below. A precision movement stage is used to move the video camera into a known position for viewing the probe points. Analysis of the video image and the stage position are used to determine the relative positions of the probe points.

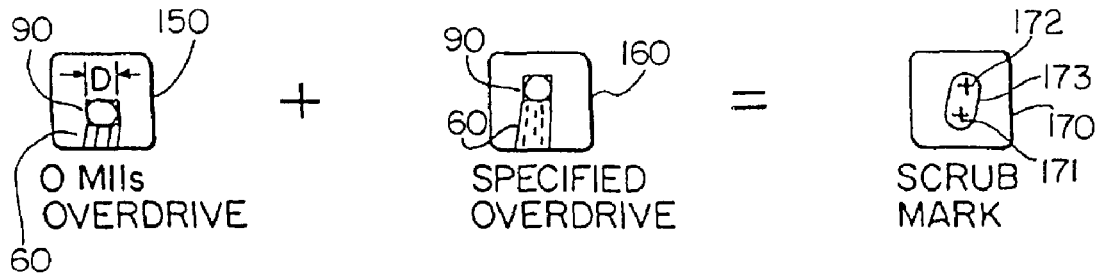

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-6 and 23 is confirmed.

Claims 7-22 and 24 were not reexamined.

\* \* \* \* \*

(12) EX PARTE REEXAMINATION CERTIFICATE (10159th)
United States Patent
Schwartz et al.

(10) Number: US 6,118,894 C3
(45) Certificate Issued: May 13, 2014

(54) INTEGRATED CIRCUIT PROBE CARD INSPECTION SYSTEM

(75) Inventors: Rodney E. Schwartz, Tempe, AZ (US); Glenn M. Wirick, Phoenix, AZ (US); Gary B. Rogers, Mesa, AZ (US)

(73) Assignee: Integrated Technology Corporation, Tempe, AZ (US)

Reexamination Request:
No. 90/013,021, Oct. 8, 2013

Reexamination Certificate for:
Patent No.: 6,118,894
Issued: Sep. 12, 2000
Appl. No.: 08/784,560
Filed: Jan. 21, 1997

Reexamination Certificate C1 6,118,894 issued May 10, 2011

Reexamination Certificate C2 6,118,894 issued Sep. 16, 2013

Related U.S. Application Data

(62) Division of application No. 08/072,206, filed on Jun. 4, 1993, now Pat. No. 5,657,394.

(51) Int. Cl.
*G01R 1/073* (2006.01)
*G01R 31/28* (2006.01)
*G01R 3/00* (2006.01)

(52) U.S. Cl.
USPC .................................... 382/151; 324/750.23

(58) Field of Classification Search
None
See application file for complete search history.

(56) References Cited

To view the complete listing of prior art documents cited during the proceeding for Reexamination Control Number 90/013,021, please refer to the USPTO's public Patent Application Information Retrieval (PAIR) system under the Display References tab.

*Primary Examiner* — Matthew Heneghan

(57) ABSTRACT

A system for inspecting integrated circuit probe cards using a video camera positioned to view probe points on the cards from below. A precision movement stage is used to move the video camera into a known position for viewing the probe points. Analysis of the video image and the stage position are used to determine the relative positions of the probe points.

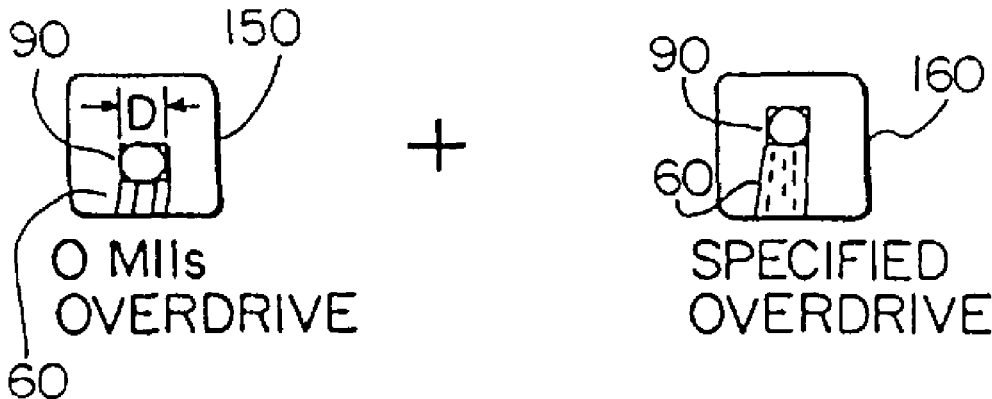

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1 and 3 is confirmed.

Claims 2 and 4-24 were not reexamined.

\* \* \* \* \*